US012658341B2

(12) United States Patent
Kim et al.

(10) Patent No.: US 12,658,341 B2
(45) Date of Patent: Jun. 16, 2026

(54) WIRE STRUCTURE, WIRE CAPACITOR, AND ELECTRONIC DEVICE INCLUDING THE WIRE CAPACITOR

(71) Applicant: SAMSUNG ELECTRONICS CO., LTD., Suwon-si (KR)

(72) Inventors: Jaehoon Kim, Suwon-si (KR); Hyun-Ji Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 257 days.

(21) Appl. No.: 18/538,822

(22) Filed: Dec. 13, 2023

(65) Prior Publication Data

US 2024/0321483 A1     Sep. 26, 2024

(30) Foreign Application Priority Data

Mar. 24, 2023    (KR) ........................ 10-2023-0039003
May 25, 2023     (KR) ........................ 10-2023-0067726

(51) Int. Cl.
| | |
|---|---|
| *H01B 7/04* | (2006.01) |
| *H01B 7/02* | (2006.01) |
| *H01G 4/08* | (2006.01) |
| *H01G 4/14* | (2006.01) |
| *H05K 1/183* | (2026.01) |
| *H10W 70/685* | (2026.01) |
| *H01G 4/01* | (2006.01) |
| *H01G 4/012* | (2006.01) |

(52) U.S. Cl.
CPC ............. *H01B 7/04* (2013.01); *H01B 7/0216* (2013.01); *H01G 4/085* (2013.01); *H01G 4/14* (2013.01); *H05K 1/183* (2013.01); *H10W 70/685* (2026.01); *H01G 4/01* (2013.01); *H01G 4/012* (2013.01); *H05K 2201/10015* (2013.01); *H05K 2201/10583* (2013.01)

(58) Field of Classification Search
CPC ........ H01B 7/04; H01B 7/0216; H01G 4/085; H01G 4/14; H01G 4/01; H01G 4/012; H01G 4/33; H01L 23/49822; H05K 1/183; H05K 2201/10015; H05K 2201/10583

See application file for complete search history.

(56) References Cited

U.S. PATENT DOCUMENTS

| | | | |
|---|---|---|---|
| 6,239,376 B1 | 5/2001 | Kimura et al. | |
| 7,906,803 B2 * | 3/2011 | Shioya ................. | H10D 62/122 |
| | | | 257/532 |

(Continued)

FOREIGN PATENT DOCUMENTS

| | | |
|---|---|---|
| KR | 10-2009-0107292 A | 10/2009 |
| KR | 10-1778361 B1 | 9/2017 |
| KR | 10-1932816 B1 | 12/2018 |

OTHER PUBLICATIONS

An introduction to Copper, Oct. 26, 2025.*

(Continued)

*Primary Examiner* — Timothy J Thompson
*Assistant Examiner* — Aditya Sharma
(74) *Attorney, Agent, or Firm* — Sughrue Mion, PLLC

(57) ABSTRACT

A wire structure includes a metal layer, a dielectric layer covering at least a portion of an outer surface of the metal layer, and a filling material provided in the dielectric layer, wherein a flexibility of the filling material is higher than a flexibility of the dielectric layer.

20 Claims, 10 Drawing Sheets

(56)         References Cited

U.S. PATENT DOCUMENTS

| | | | |
|---|---|---|---|
| 10,629,520 | B2 | 4/2020 | Haga |
| 11,462,462 | B2 * | 10/2022 | Yoo ..................... H01L 23/3121 |
| 2004/0097069 | A1 * | 5/2004 | Weng ................ H01L 21/31144 |
| | | | 438/631 |
| 2008/0128880 | A1 | 6/2008 | Takiar et al. |
| 2013/0043067 | A1 * | 2/2013 | Hayashi ................. H05K 1/036 |
| | | | 977/932 |
| 2015/0098170 | A1 | 4/2015 | Milke et al. |
| 2018/0240800 | A1 * | 8/2018 | Ahn ....................... H10D 1/716 |
| 2020/0091059 | A1 * | 3/2020 | Lin ................... H01L 23/49811 |
| 2023/0245828 | A1 * | 8/2023 | Park ......................... H01G 4/28 |
| | | | 257/737 |

OTHER PUBLICATIONS

Youngs Modulus of Advanced Ceramics, Greast ceramic making, Oct. 26, 2025.*
Wax Density, Strenth, Melting Point, Thermal Conductivity, Oct. 26, 2025.*

* cited by examiner

100

WS

WS

WIRE STRUCTURE, WIRE CAPACITOR, AND ELECTRONIC DEVICE INCLUDING THE WIRE CAPACITOR

CROSS-REFERENCE TO RELATED APPLICATIONS

This application is based on and claims priority under 35 U.S.C. § 119 to Korean Patent Application No. 10-2023-0039003, filed on Mar. 24, 2023, and Korean Patent Application No. 10-2023-0067726, filed on May 25, 2023, in the Korean Intellectual Property Office, the disclosures of which are incorporated by reference herein in their entireties.

BACKGROUND

The present disclosure relates to a wire structure, a wire capacitor, and an electronic device including the wire capacitor, and more particularly, to a wire structure which is improved in structural stability, a wire capacitor which is improved in structural stability, and an electronic device including the wire capacitor.

As the technology in the field of semiconductors advances, it is advantageous for semiconductor devices to have smaller sizes, higher performance, and higher reliability. To achieve the size reduction of semiconductor devices, it is a trend for the spacing between semiconductor patterns to be reduced.

Wire capacitors, which are next-generation capacitors required for semiconductor devices, are increasingly reduced in size, and are mounted as close to chips as possible due to small form factors thereof and, thus, may maintain high performance even in high-frequency environments. However, because wire capacitors are arranged with bent shapes in semiconductor devices, wire capacitors having high structural stability are advantageous.

SUMMARY

Example embodiments provide a wire structure which may have improved structural stability, a wire capacitor which may have improved structural stability, and an electronic device including the wire capacitor.

Further, example embodiments provide a wire structure which may have improved structural stability against bending, a wire capacitor which may have improved structural stability against bending, and an electronic device including the wire capacitor.

According to an aspect of one or more example embodiments, a wire structure includes: a metal layer; a dielectric layer covering at least a portion of an outer surface of the metal layer; and a filling material provided in the dielectric layer, wherein a flexibility of the filling material is higher than a flexibility of the dielectric layer According to an aspect of one or more example embodiments, a wire capacitor includes: a first metal layer; a dielectric layer covering at least a portion of an outer surface of the first metal layer; a second metal layer covering at least a portion of an outer surface of the dielectric layer; and a filling material provided in the dielectric layer, wherein a flexibility of the filling material is higher than a flexibility of the dielectric layer.

According to an aspect of one or more example embodiments, an electronic device includes: a substrate including: a base insulating layer; a plurality of line patterns provided in the base insulating layer; and a plurality of vias provided in the base insulating layer and contacting, and electrically connecting to, at least some line patterns of the plurality of line patterns; and a wire capacitor contacting at least some line patterns of the plurality of line patterns and configured to store charges, wherein the wire capacitor comprises: a first metal layer; a dielectric layer covering at least a portion of an outer surface of the first metal layer; a second metal layer covering at least a portion of an outer surface of the dielectric layer; and a filling material provided in the dielectric layer, wherein a flexibility of the filling material is higher than a flexibility of the dielectric layer.

BRIEF DESCRIPTION OF THE DRAWINGS

The above and other aspects and features will be more apparent from the following detailed description of example embodiments taken in conjunction with the accompanying drawings, in which.

DETAILED DESCRIPTION

Figure 1:
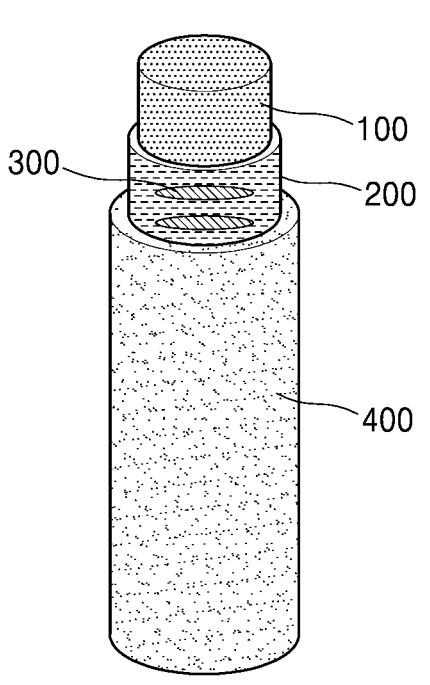
FIG. 1 is a perspective view illustrating a wire capacitor according to one or more example embodiments.

Hereinafter, example embodiments will be described in detail with reference to the accompanying drawings. Like components are denoted by like reference numerals throughout the specification, and duplicate descriptions thereof are omitted.

Figure 2:
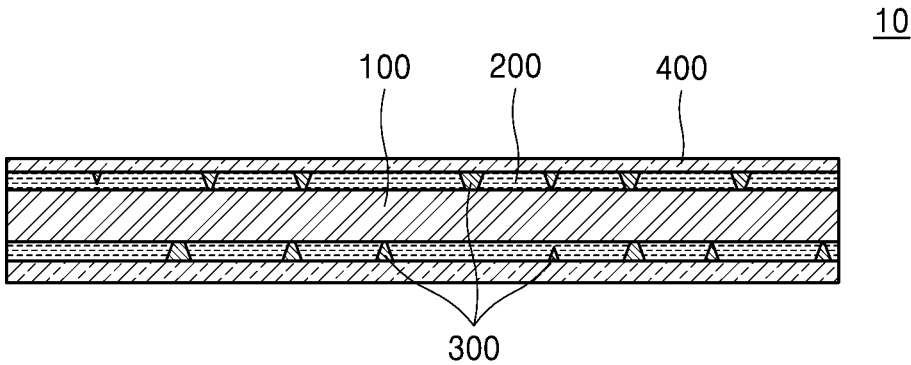
FIG. 2 is a cross-sectional view illustrating a wire capacitor according to one or more example embodiments.

FIG. 1 is a perspective view illustrating a wire capacitor according to one or more example embodiments, FIG. 2 is a cross-sectional view illustrating a wire capacitor according to one or more example embodiments.

Referring to FIGS. 1 and 2, according to one or more example embodiments, a wire capacitor 10 may include a first metal layer 100, a dielectric layer 200, a filling material 300, and a second metal layer 400. The wire capacitor 10 may refer to a capacitor that uses a wire as a conductive component. The wire capacitor 10 may include the first metal layer 100 and the second metal layer 400, which are spaced apart from each other with the dielectric layer 200 therebetween. The first metal layer 100 and the second metal layer 400 of the wire capacitor 10 may respectively correspond to plates of a capacitor, and the dielectric layer 200 may correspond to a dielectric of the capacitor.

The first metal layer 100 may have a cylindrical shape having a constant diameter and may extend lengthwise. For example, the first metal layer 100 may have a wire shape having a circular-shaped cross-section and extending lengthwise. According to one or more example embodiments the length of the first metal layer 100 may be greater than the radius of the first metal layer 100. The first metal layer 100 may have two surfaces, which are spaced apart from each other in the length direction thereof, and a side surface connecting the two surfaces to each other. In one or more example embodiments, the first metal layer 100 may have a shape having a cross-section of an elliptical, polygonal, and/or atypical shape and the first metal layer 100 may extend lengthwise.

The dielectric layer 200 may have a hollow cylindrical shape and may extend lengthwise. The dielectric layer 200 may cover at least a portion of the side surface of the first metal layer 100. For example, the dielectric layer 200 may include a dielectric material in which polarization occurs. For example, the dielectric layer 200 may include an oxide of a metal that is included in the first metal layer 100. An inner side surface of the dielectric layer 200 may contact the first metal layer 100 and an outer side surface of the dielectric layer 200 may contact the second metal layer 400.

The filling material 300 may be provided in the dielectric layer 200. One side of the filling material 300 may contact the second metal layer 400 and the other side of the filling material 300 may contact the first metal layer 100 and/or the dielectric layer 200. The filling material 300 may be surrounded by the dielectric layer 200. The filling material 300 may have a tapered shape having a decreasing width toward the first metal layer 100. In one or more example embodiments, the filling material 300 may have a tapered shape having an increasing width toward the first metal layer 100.

The filling material 300 may have an elliptical shape in which the circumferential-direction width thereof is greater than the length-direction width thereof. In one or more example embodiments, the filling material 300 may have an elliptical shape in which the length-direction width thereof is greater than the circumferential-direction width thereof. In one or more example embodiments, the filling material 300 may have a circular shape, a polygonal shape, and/or an atypical shape.

The second metal layer 400 may have a hollow cylindrical shape and may extend lengthwise. The second metal layer 400 may surround the first metal layer 100, the dielectric layer 200, and the filling material 300. For example, the second metal layer 400 may contact a side surface of the dielectric layer 200 and with the filling material 300.

The first metal layer 100 may have a radial-direction thickness from about 5 μm to about 200 μm. The radial-direction thickness of the first metal layer 100 may be greater than each of the radial-direction thickness of the dielectric layer 200 and the radial-direction thickness of the second metal layer 400. Each of the dielectric layer 200 and the second metal layer 400 may have a radial-direction thickness from about 100 nm to about 1 μm. The radial-direction thickness of the filling material 300 may be less than or equal to the radial-direction thickness of the dielectric layer 200.

According to one or more example embodiments, the term "radial direction" may refer to a direction from the center of the first metal layer 100 toward the second metal layer 400, and the term "length direction" may refer to a direction in which the first metal layer 100 extends lengthwise. In addition, the term "circumferential direction" according to one or more example embodiments may refer to a direction following the circumference of the first metal layer 100.

The filling material 300 may include a material having higher flexibility than the dielectric layer 200. For example, the filling material 300 may include a material having a Young's modulus that is lower than that of the dielectric layer 200. In addition, the dielectric layer 200 may include a material having a Young's modulus that is higher than that of each of the first metal layer 100 and the second metal layer 400.

Young's modulus is a physical quantity corresponding to the stiffness or elasticity of a material, and a material having a low Young's modulus may have higher flexibility than a material having a high Young's modulus. That is, the filling material 300 may have higher flexibility than the first metal layer 100. In addition, the dielectric layer 200 may have lower flexibility than the first metal layer 100. By providing the filling material 300 having high flexibility in the dielectric layer 200, the flexibility of the wire capacitor 10 may be increased. In addition, the filling material 300 may include a material having electrically insulating properties.

For example, the first metal layer 100 and/or the second metal layer 400 may include, but is not limited to, at least one of copper (Cu), aluminum (Al), tin (Sn), magnesium (Mg), tungsten (W), titanium (Ti), nickel (Ni), platinum (Pt), gold (Au), silver (Ag), or a combination thereof. In addition, the dielectric layer 200 may include, but is not limited to, at least one of hafnium oxide ($HfO_2$), hafnium oxynitride (HfON), hafnium silicon oxide ($HfSiO_x$), lanthanum oxide ($La_2O_3$), lanthanum aluminum oxide ($LaAlO_3$), zirconium oxide ($ZrO_2$), zirconium silicon oxide ($ZrSi_xO_y$), tantalum oxide ($Ta_2O_5$), barium strontium titanium oxide ($BaO_6SrTi_2$), barium titanium oxide ($BaTiO_3$), strontium titanium oxide ($SrTiO_3$), niobium oxide ($Nb_2O_5$), yttrium oxide ($Y_2O_3$), aluminum oxide ($Al_2O_3$), lead scandium tantalum oxide ($Pb_2ScTaO_6$), or a combination thereof.

The filling material 300 may include an insulating material. For example, the filling material 300 may include a material having a permittivity of 3 or more. For example, the filling material 300 may include a polymer. For example, the filling material 300 may include, but is not limited to, polyphenylene sulfide (PPS), fluorene polyester (FPE), polysulfone, polyethylenimine (PEI), polyethylene naphthalate (PEN), polyethylene terephthalate (PET), polyamide (PA), polyethersulfone (PES), nylon, polyimide (PI), polyamide-imide (PAI), polyurethane, polyvinyl chloride (PVC), siloxane-polar pendant, and/or cyanoethyl cellulose.

For example, the filling material 300 may be formed by mixing two or more materials with each other. For example, the filling material 300 may be formed by mixing a polymer and a filler with each other. For example, the polymer may include, but is not limited to, one of polydimethylsiloxane (PDMS), a vinylidene fluoride (PVDF)-hexafluoropropylene (HFP) polymer, acrylonitrile butadiene styrene (ABS), polymethylmethacrylate (PMMA), and polyvinyl alcohol (PVA). In addition, the filler may include one of magnesium (Mg)-doped calcium copper titanate (CCTO), barium titanate ($BaTiO_3$), magnesium chloride ($MgCl_2$), a carbon nanotube, a multi-walled carbon nanotube (MWCNT), a graphene oxide-carbon nanotube composite, boron nitride (BN), titanium dioxide ($TiO_2$), or a salt including a triethylene diamine (TEDA) cation.

The mass of the filler mixed may be about 100 ppm to about 70% of the mass of the polymer mixed. For example, the mass of the filler mixed may be about 1% to about 25% of the mass of the polymer mixed.

Because a general wire capacitor does not include a filling material in a dielectric layer, the flexibility of the dielectric layer is relatively low. Accordingly, when the general wire capacitor is bent, the reliability of the general wire capacitor is relatively low, and the bending may cause damage to the dielectric layer.

On the other hand, the wire capacitor 10 according to one or more example embodiments includes the filling material 300 in the dielectric layer 200, and, thus, the flexibility of the dielectric layer 200 may be increased. Therefore, even when the wire capacitor 10 is bent, damage to the dielectric layer 200 may be reduced, thereby improving the reliability of the wire capacitor 10.

Figure 3:
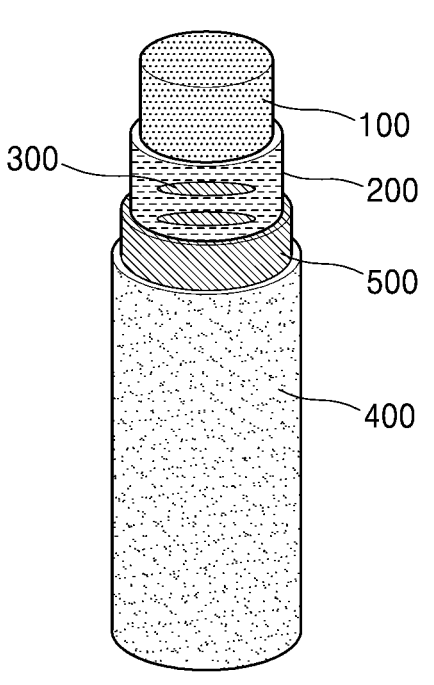
FIG. 3 is a perspective view illustrating a wire capacitor according to one or more example embodiments.
Figure 4:
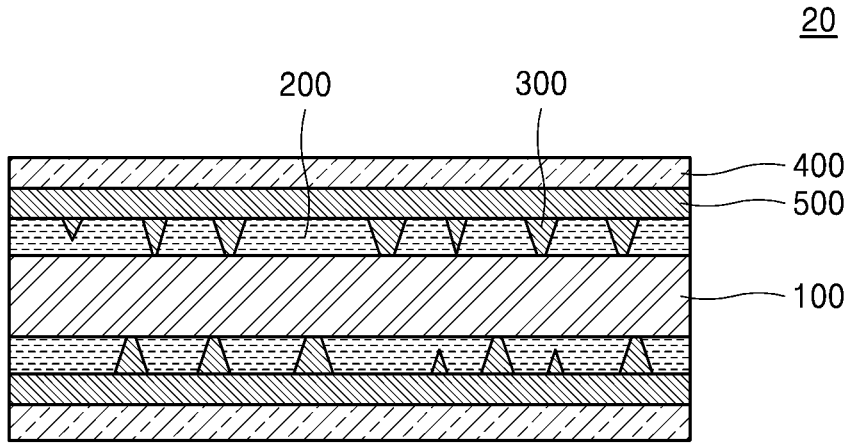
FIG. 4 is a cross-sectional view illustrating a wire capacitor according to one or more example embodiments.

FIG. 3 is a perspective view illustrating a wire capacitor according to one or more example embodiments, and FIG. 4 is a cross-sectional view illustrating a wire capacitor according to one or more example embodiments. FIGS. 1 and 2 may also be referred to describe one or more example embodiments.

Referring to one or more example embodiments shown in FIGS. 3 and 4, a wire capacitor 20 may include a first metal layer 100, a dielectric layer 200, a filling material 300, a second metal layer 400, and a filling layer 500.

Because the first metal layer 100, the dielectric layer 200, and the filling material 300 of FIGS. 3 and 4 are substantially the same as the first metal layer 100, the dielectric layer 200, and the filling material 300 of one or more example embodiments shown in FIGS. 1 and 2, respectively, the second metal layer 400 and the filling layer 500 are described below.

The filling layer 500 may be provided between the dielectric layer 200 and the second metal layer 400. The filling layer 500 may have a hollow cylindrical shape and may extend lengthwise. The filling layer 500 may surround an outer side surface of the dielectric layer 200. An outer side surface of the filling layer 500 may contact an inner side surface of the second metal layer 400, and an inner side surface of the filling layer 500 may contact the dielectric layer 200 and/or the filling material 300. The thickness of the filling layer 500 may be substantially equal to or less than the radial-direction thickness of the dielectric layer 200 and/or the radial-direction thickness of the second metal layer 400.

The filling material 300 and the filling layer 500 are just formally distinguished from each other for description of one or more example embodiments, and the filling material 300 and the filling layer 500 may include the same material and may have shapes that are integrally coupled to each other. That is, the filling layer 500 provided in the dielectric layer 200 may be referenced similar to the filling material 300.

Figure 5:
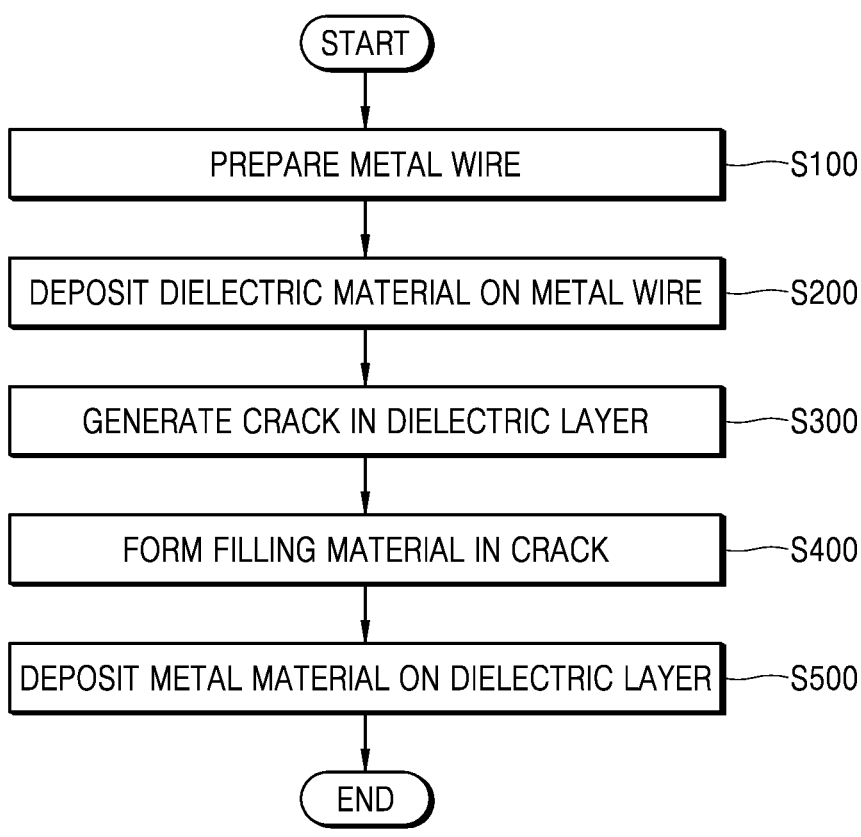
FIG. 5 is a flowchart of a method of fabricating a wire capacitor, according to one or more example embodiments.
Figure 10:
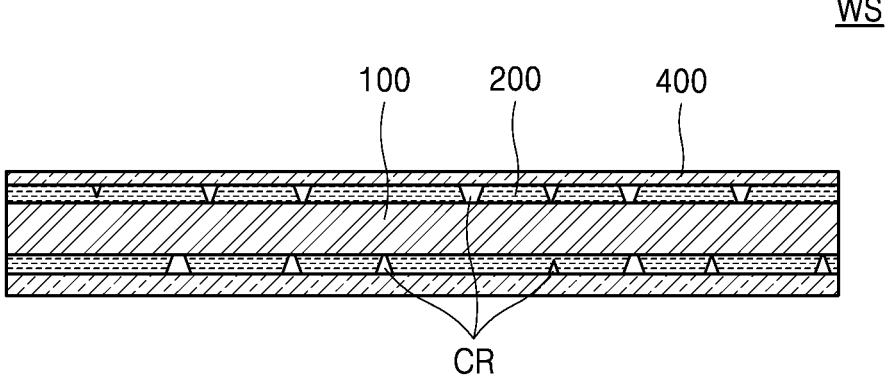
Figure 11:
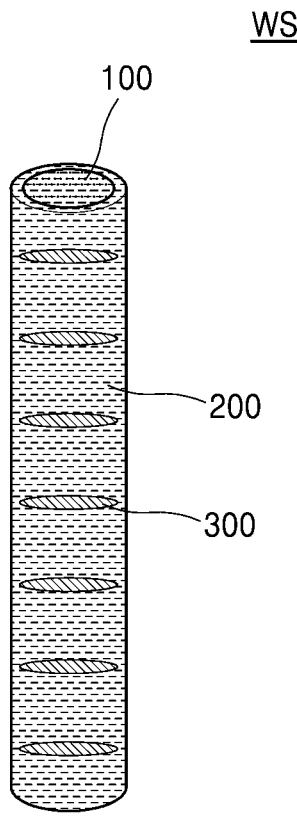
Figure 12:
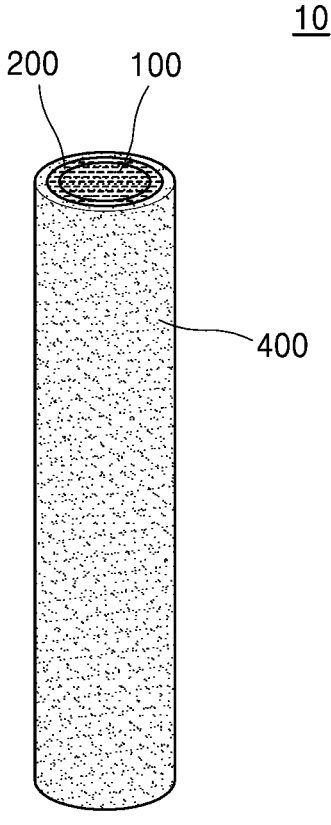

FIG. 5 is a flowchart of a method of fabricating a wire capacitor, according to one or more example embodiments. FIGS. 6, 7, 8, 9, 10, 11 and 12 are diagrams illustrating a method of fabricating a wire capacitor, according to one or more example embodiments. FIG. 10 is a cross-sectional view for FIG. 9, according to one or more example embodiments. FIGS. 1, 2, 3 and 4 may also be references to describe one or more example embodiments.

Figure 6:
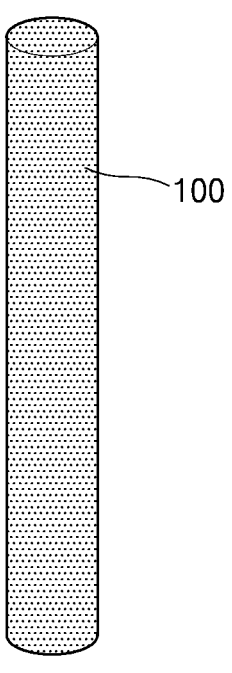
FIGS. 6, 7, 8, 9, 10, 11 and 12 are diagrams illustrating a method of fabricating a wire capacitor, according to one or more example embodiments.

Referring to FIGS. 5 and 6, a metal wire may be prepared first (S100). The metal wire may correspond to the first metal layer 100. According to one or more example embodiments the first metal layer 100 may have a cylindrical shape having a constant diameter and may extend lengthwise. For example, the first metal layer 100 may include, but is not limited to, at least one of copper (Cu), aluminum (Al), tin (Sn), magnesium (Mg), tungsten (W), titanium (Ti), nickel (Ni), platinum (Pt), gold (Au), silver (Ag), or a combination thereof, and may extend with a wire shape. The first metal layer 100 may have two surfaces, which are spaced apart from each other in the length direction thereof, and a side surface connecting the two surfaces to each other.

Figure 7:
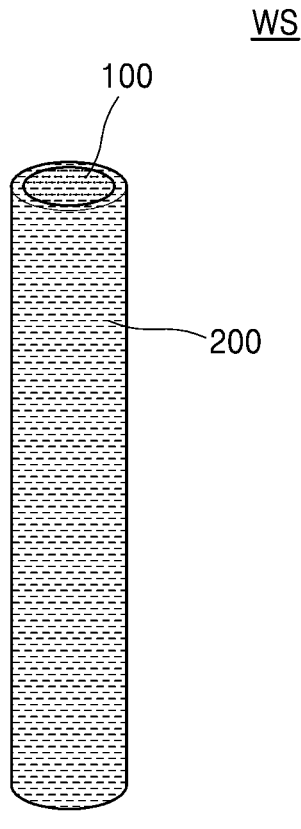

Referring to FIGS. 5 and 7, a dielectric material may be deposited on the metal wire (S200). For example, the dielectric material may be deposited on the side surface of the first metal layer 100. For example, the dielectric material may be deposited on the side surface of the first metal layer 100 by at least one process selected from among physical vapor deposition (PVD), chemical vapor deposition (CVD), and atomic layer deposition (ALD). For example, the dielectric material may include a metal oxide. For example, the dielectric material may include, but is not limited to, at least one of hafnium oxide ($HfO_2$), hafnium oxynitride (HfON), hafnium silicon oxide ($HfSiO_x$), lanthanum oxide ($La_2O_3$), lanthanum aluminum oxide ($LaAlO_3$), zirconium oxide ($ZrO_2$), zirconium silicon oxide ($ZrSi_xO_y$), tantalum oxide ($Ta_2O_5$), barium strontium titanium oxide ($BaO_6SrTi_2$), barium titanium oxide ($BaTiO_3$), strontium titanium oxide ($SrTiO_3$), niobium oxide ($Nb_2O_5$), yttrium oxide ($Y_2O_3$), aluminum oxide ($Al_2O_3$), lead scandium tantalum oxide ($Pb_2ScTaO_6$), or a combination thereof.

The dielectric material deposited on the side surface of the first metal layer 100 may form the dielectric layer 200. The dielectric layer 200 may have a hollow cylindrical shape and may extend lengthwise. The dielectric layer 200 may surround at least a portion of the side surface of the first metal layer 100. An inner side surface of the dielectric layer 200 may contact the first metal layer 100. The first metal layer 100 and the dielectric layer 200 surrounding the first metal layer 100 may be collectively referred to as a wire structure WS, according to one or more example embodiments.

Referring to FIGS. 5 and 8, 9 and 10, a crack CR may be generated in the dielectric layer 200 by applying external force to the dielectric layer 200. A process of generating the crack CR in the dielectric layer 200 may be as follows. First, the wire structure WS may be supplied to a roller RL via a wire structure inlet (that is, WS inlet). The wire structure WS supplied to the roller RL may be bent. Because the dielectric layer 200 includes a material having low flexibility, when the dielectric layer 200 is bent, the crack CR may be generated in the dielectric layer 200. An end of the crack CR may be at the outer side surface of the dielectric layer 200 and the other end of the crack CR may contact the side surface of the first metal layer 100 and/or may be in the dielectric layer 200. The crack CR may have a tapered shape having a decreasing width toward the first metal layer 100. In one or more example embodiments, the crack CR may have a tapered shape having an increasing width moving toward the first metal layer 100.

The crack CR may have an elliptical shape in which the circumferential-direction width thereof is greater than the length-direction width thereof. In one or more example embodiments, the crack CR may have an elliptical shape in which the length-direction width thereof is greater than the circumferential-direction width. In one or more example embodiments, the crack CR may have a circular shape, a polygonal shape, and/or an atypical shape.

In addition, a filling material supply line (that is, FM inlet) for supplying a filling material FM in a liquid state may be provided adjacent to one end of the roller RL. The filling material supply line (that is, FM inlet) may be connected to a filling material supply tank and thus may supply the filling material FM in a liquid state to the wire structure WS. For example, the filling material supply line (that is, FM inlet) may supply the filling material FM in a liquid state to the crack CR of the wire structure WS. The filling material supply tank may include, for example, a heater for heating and liquefying a filling material in a solid state.

The filling material FM in a liquid state is supplied from the filling material supply line (that is, FM inlet) to the crack CR, whereby the filling material 300 may be formed in the dielectric layer 200. Therefore, the filling material 300 may be formed in the crack CR. The filling material 300 may contact the first metal layer 100 and/or the dielectric layer 200. For example, when the filling material 300 contacts the first metal layer 100, the radial-direction thickness of the filling material 300 may be equal to the radial-direction thickness of the dielectric layer 200. In addition, when the filling material 300 does not contact the first metal layer 100, the radial-direction thickness of the filling material 300 may be less than the radial-direction thickness of the dielectric layer 200.

For example, the filling material 300 may include an insulating material. For example, the filling material 300 may include a material having a permittivity of 3 or more. For example, the filling material 300 may include a polymer. For example, the filling material 300 may include PPS, FPE, polysulfone, PEI, PEN, PET, PA, PES, nylon, PI, PAI, polyurethane, PVC, siloxane-polar pendant, and/or cyanoethyl cellulose.

For example, the filling material 300 may be formed by mixing two or more materials with each other. For example, the filling material 300 may be formed by mixing a polymer and a filler with each other. For example, the polymer may include one of PDMS, a PVDF-HFP polymer, ABS, PMMA, and PVA. In addition, the filler may include one of magnesium (Mg)-doped CCTO, barium titanate ($BaTiO_3$), magnesium chloride ($MgCl_2$), a carbon nanotube, an MWCNT, a graphene oxide-carbon nanotube composite, boron nitride (BN), titanium dioxide ($TiO_2$), or a salt including a TEDA cation.

Figure 8:
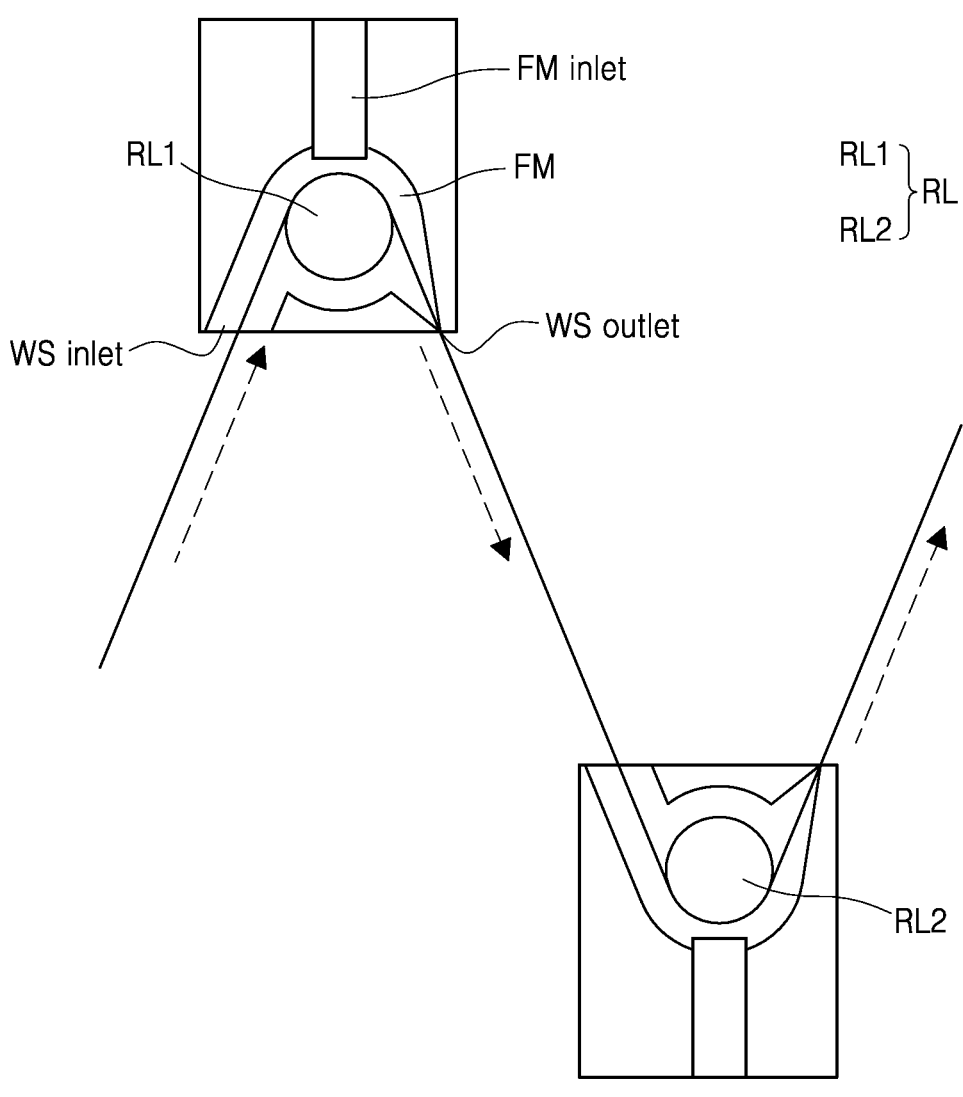
Figure 9:
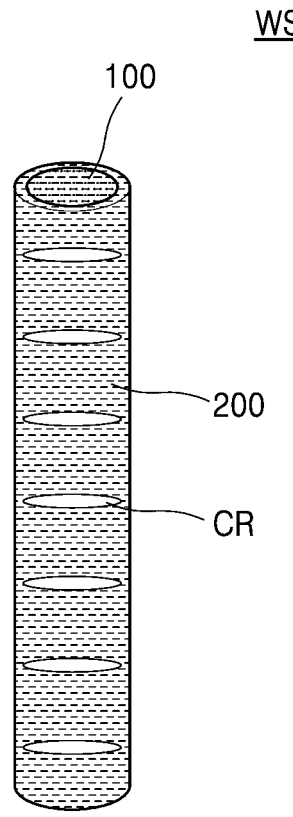

Although not shown in FIG. 8, the filling material FM in a liquid state may be light-treated or heat-treated and, thus, cured. The filling material 300 having a lower Young's modulus than the dielectric layer 200 may be provided in the dielectric layer 200, thereby increasing the flexibility of the dielectric layer 200.

Although FIG. 8 illustrates one or more example embodiments in which two rollers, that is, first and second rollers RL1 and RL2, are provided to face each other, the number and locations of rollers RL that are provided are not limited thereto. For example, one roller RL or three or more rollers RL may be provided, and each roller RL may generate the crack CR of the wire structure WS at various angles.

Referring to FIGS. 5 and 10, a metal material may be deposited on the outer side surface of the dielectric layer 200 (S500). For example, the metal material may be deposited on the outer side surface of the dielectric layer 200 by at least one process selected from among PVD, CVD, and ALD. The metal material deposited on the outer side surface of the dielectric layer 200 may form the second metal layer 400. The second metal layer 400 may have a hollow cylindrical shape and may extend lengthwise. The second metal layer 400 may surround at least a portion of the outer side surface of the dielectric layer 200. The inner side surface of the second metal layer 400 may contact the dielectric layer 200 and the filling material 300.

In addition, unlike one or more example embodiments of FIG. 10, when the filling layer 500 is formed on the outer side surface of the dielectric layer 200 by coating a filling material thereon to surround the outer side surface of the dielectric layer 200, the wire capacitor 20 of FIGS. 3 and 4 may be formed. That is, the filling material FM in a liquid state, which is provided in the crack CR (see e.g., FIG. 9) of the dielectric layer 200, may become the filling material 300, and the filling material FM in a liquid state, which is formed on the outer side surface of the dielectric layer 200, may become the filling layer 500.

Figure 13:
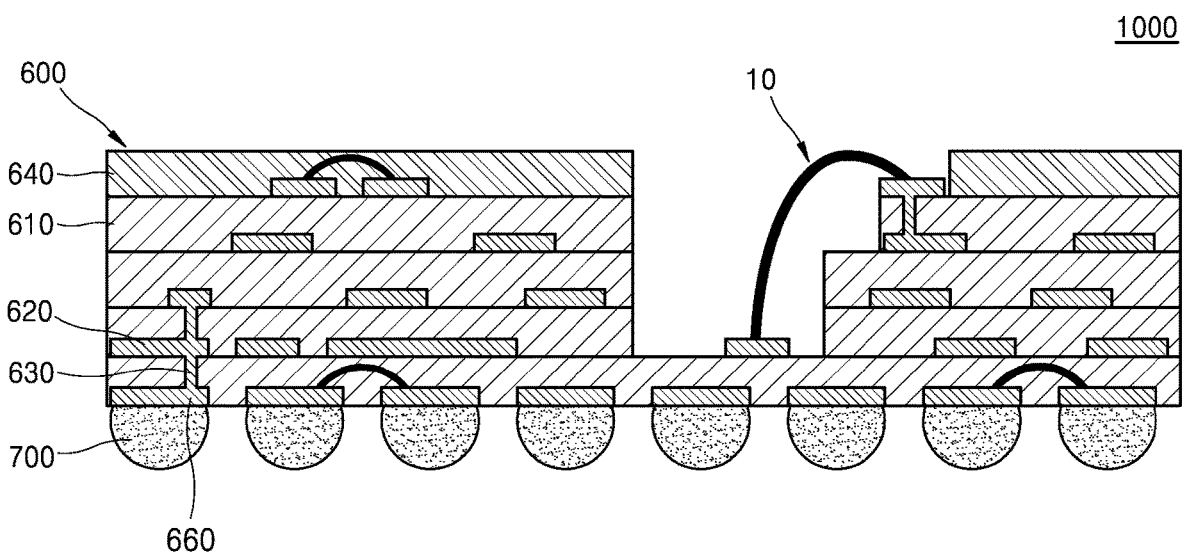
FIG. 13 is a cross-sectional view illustrating an electronic device including a wire capacitor according to one or more example embodiments.

FIG. 13 is a cross-sectional view illustrating an electronic device including a wire capacitor according to one or more example embodiments. FIGS. 1, 2, 3 and 4 may also be referred to describe one or more example embodiments.

Referring to FIG. 13, an electronic device 1000 may include a wire capacitor 10 and a substrate 600. The substrate 600 may include, for example, a printed circuit board (PCB). The substrate 600 may include a plurality of base insulating layers 610, a plurality of line patterns 620, a plurality of vias 630, and an upper protective layer 640. The plurality of base insulating layers 610 may be formed from, for example, a photo-imageable dielectric (PID) or a photosensitive polyimide (PSPI). The plurality of base insulating layers 610 may include, for example, at least one material selected from Flame Retardant 4 (FR-4), tetrafunctional epoxy, polyphenylene ether, epoxy/polyphenylene oxide, bismaleimide triazine (BT), Thermount, cyanate ester, polyimide, or a liquid crystal polymer.

The plurality of line patterns 620 and the plurality of vias 630 may each include, but are not limited to, a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), or an alloy thereof. In one or more example embodiments, each of the plurality of line patterns 620 and the plurality of vias 630 may be formed by stacking a metal or an alloy of metals on a seed layer including titanium, titanium nitride, or titanium tungsten, or the like.

The plurality of line patterns 620 may be provided on at least one of upper and lower surfaces of the plurality of base insulating layers 610. The plurality of vias 630 may pass through the plurality of base insulating layers 610 in the vertical direction (Z direction) to be respectively in contact with, and connected with, some of the plurality of line patterns 620. In one or more example embodiments, at least some of the plurality of line patterns 620 may be formed together with, and thus integrated with, some of the plurality of vias 630, respectively. For example, the plurality of line patterns 620 may be integrated with the plurality of vias 630 contacting an upper surface of the plurality of line patterns 620. The plurality of base insulating layers 610 may surround the plurality of line patterns 620 and the plurality of vias 630. In one or more example embodiments, the plurality of vias 630 may each have a tapered shape extending with a decreasing horizontal width from the bottom toward the top thereof.

One from among the plurality of line patterns 620, which is provided on a lower surface of the lowermost one of the plurality of base insulating layers 610, may be referred to as a lower pad 660. A plurality of connection terminals 700 may be attached to a plurality of lower pads 660, respectively. For example, a connection terminal 700 may include a solder ball or a bump.

The upper protective layer 640 may be provided on an upper surface of the uppermost one of the plurality of base insulating layers 610. The upper protective layer 640 may cover and protect at least one of plurality of base insulating layers 610. For example, the upper protective layer 640 may include a solder resist.

The upper protective layer 640 may be formed by coating a solder mask insulating ink on an upper surface of at least one of the plurality of base insulating layers 610 by a method of screen printing or inkjet printing, followed by curing the solder mask insulating ink with heat, ultraviolet (UV) light, or infrared (IR) light.

In one or more example embodiments, a photo-imageable solder resist may be coated on the entire upper and lower surfaces of at least one of the plurality of base insulating layer 610 by a screen printing method or a spray coating method or a solder resist material may be boned to the entire upper and lower surfaces thereof by a laminating method, followed by removing unnecessary portions of the photo-imageable solder resist or the solder resist material through light-exposure and development. Then, the photo-imageable solder resist or the solder resist material may be cured with heat, UV light, or IR light, thereby forming the upper protective layer 640.

Although FIG. 13 illustrates, as one or more example embodiments, only the upper protective layer 640 that is formed on the upper surface of the uppermost one of the plurality of base insulating layers 610, one or more example embodiments are not limited thereto. For example, a lower protective layer may be provided on the lower surface of the lowermost one of the base insulating layers 610.

The wire capacitor 10 may electrically connect the plurality of line patterns 620, which are spaced apart from each other, to each other. The wire capacitor 10 may have curvature and may electrically connect the plurality of line patterns 620, which are spaced apart from each other, to each other. For example, while the wire capacitor 10 is bent, the wire capacitor 10 may electrically connect the plurality of line patterns 620, which are spaced apart from each other, to each other. Therefore, as described above, the filling material 300 may be provided in the dielectric layer 200 having relatively low flexibility, thereby increasing the flexibility of the dielectric layer 200.

For example, at least some of a plurality of wire capacitors 10 may each have both ends at a substantially equal vertical level. In addition, for example, at least some of the plurality of wire capacitors 10 may each have both ends at different vertical levels from each other.

According to one or more example embodiments, a direction that is parallel to a main surface of the substrate 600 may be referred to as a horizontal direction (X direction and/or Y direction), and a direction that is perpendicular to the horizontal direction (X direction and/or Y direction) may be referred to as a vertical direction (Z direction).

The wire capacitor 10 may be provided inside the plurality of base insulating layers 610 to electrically connect the plurality of line patterns 620, which are spaced apart from each other, to each other. The wire capacitor 10 may be provided outside the plurality of base insulating layers 610 to electrically connect the plurality of line patterns 620, which are spaced apart from each other, to each other, and/or may be provided inside a solder resist (for example, the upper protective layer 640) to electrically connect the plurality of line patterns 620, which are spaced apart from each other, to each other.

Although FIG. 13 illustrates one or more example embodiments in which the wire capacitor 10 is provided in the substrate 600, according to one or more example embodiments, the wire capacitor 10 may be provided between a semiconductor chip and the substrate 600. In addition, although FIG. 13 illustrates one or more example embodiments in which the wire capacitor 10 of one or more example embodiments of FIGS. 1 and 2 is provided in the substrate 600, according to one or more example embodiments the wire capacitor 20 of FIGS. 3 and 4 may be provided in the substrate 600.

As such, each of the wire capacitors 10 and 20 according to one or more example embodiments may include the filling material 300 having enhanced structural stability and, thus, may be used in a PCB. That is, each of the wire capacitors 10 and 20 according to one or more example embodiments may be widely used in the field of fabricating flexible circuits.

While example embodiments have been particularly shown and described, it will be apparent to those skilled in the art that various changes in form and details may be made therein without departing from the spirit and scope of the following claims.

What is claimed is:

1. A wire structure comprising:
   a metal layer;
   a dielectric layer covering at least a portion of an outer surface of the metal layer, the dielectric layer being hollow and cylindrical; and
   a filling material provided in the dielectric layer and filling cracks generated by applying an external force to the dielectric layer,
   wherein a flexibility of the filling material is higher than a flexibility of the dielectric layer.

2. The wire structure of claim 1, wherein the filling material comprises:
   a first filling material which contacts the metal layer; and
   a second filling material which is spaced apart from the metal layer.

3. The wire structure of claim 1, wherein a length of the filling material in a circumferential-direction of the metal layer is greater than a length of the filling material in a length direction of the metal layer.

4. The wire structure of claim 1, further comprising a filling layer which covers an outer surface of the dielectric layer.

5. The wire structure of claim 1, wherein a thickness of the filling material in a radial direction of the metal layer is less than or equal to a thickness of the dielectric layer in the radial direction.

6. The wire structure of claim 1, wherein the filling material has a tapered shape having a decreasing horizontal width toward the metal layer.

7. The wire structure of claim 1, wherein a Young's modulus of the filling material is less than a Young's modulus of the dielectric layer.

8. The wire structure of claim 1, wherein the filling material comprises a polymeric material having insulating properties.

9. A wire capacitor comprising:
   a first metal layer;
   a dielectric layer covering at least a portion of an outer surface of the first metal layer, the dielectric layer being hollow and cylindrical;
   a second metal layer covering at least a portion of an outer surface of the dielectric layer; and
   a filling material provided in the dielectric layer and filling cracks generated by applying an external force to the dielectric layer,
   wherein a flexibility of the filling material is higher than a flexibility of the dielectric layer.

10. The wire capacitor of claim 9, wherein a first surface of the filling material contacts the second metal layer, and
   a second surface of the filling material contacts the dielectric layer or the first metal layer.

11. The wire capacitor of claim 10, wherein a flexibility of the first metal layer is higher than the flexibility of the dielectric layer.

12. The wire capacitor of claim 9, further comprising a filling layer provided between the dielectric layer and the second metal layer.

13. The wire capacitor of claim 12, wherein the filling material is formed integrally with the filling layer.

14. The wire capacitor of claim 12, wherein a thickness of the filling layer in a radial direction of the first metal layer is less than or equal to a thickness of the dielectric layer in the radial direction.

15. The wire capacitor of claim 9, wherein a thickness of the first metal layer in a radial direction of the first metal layer is in a range of from about 5 μm to about 200 μm, and wherein a thickness of each of the dielectric layer, the filling material, and the second metal layer, in the radial direction, is in a range of from about 100 nm to about 1 μm.

16. An electronic device comprising:

a substrate comprising:

a base insulating layer;

a plurality of line patterns provided in the base insulating layer; and a plurality of vias provided in the base insulating layer and contacting and electrically connected to at least some line patterns of the plurality of line patterns; and a wire capacitor contacting at least some line patterns of the plurality of line patterns and configured to store charges,

12 wherein the wire capacitor comprises:

a first metal layer;

a dielectric layer covering at least a portion of an outer surface of the first metal layer, the dielectric layer being hollow and cylindrical;

a second metal layer covering at least a portion of an outer surface of the dielectric layer; and a filling material provided in the dielectric layer and filling cracks generated by applying an external force to the dielectric layer, wherein a flexibility of the filling material is higher than a flexibility of the dielectric layer.

17. The electronic device of claim 16, wherein the wire capacitor is bent.

18. The electronic device of claim 16, further comprising a filling layer provided between the dielectric layer and the second metal layer, and having a hollow cylindrical shape.

19. The electronic device of claim 16, wherein both ends of the wire capacitor are provided at a same vertical level.

20. The electronic device of claim 16, wherein both ends of the wire capacitor are provided at different vertical levels.

* * * * *